(12) United States Patent
Niu et al.

(10) Patent No.: US 12,342,653 B2
(45) Date of Patent: Jun. 24, 2025

(54) AUTOMATIC ALIGNMENT DEVICE AND ALIGNMENT METHOD FOR PHOTOVOLTAIC MODULE FILM

(71) Applicant: SUZHOU SC-SOLAR EQUIPMENT CO., LTD, Suzhou (CN)

(72) Inventors: Ruibo Niu, Suzhou (CN); Xiaoyong Wang, Suzhou (CN)

(73) Assignee: SUZHOU SC-SOLAR EQUIPMENT CO., LTD, Suzhou (CN)

( * ) Notice: Subject to any disclaimer, the term of this patent is extended or adjusted under 35 U.S.C. 154(b) by 0 days.

(21) Appl. No.: 18/741,272

(22) Filed: Jun. 12, 2024

(65) Prior Publication Data
US 2024/0421241 A1  Dec. 19, 2024

(30) Foreign Application Priority Data

Jun. 13, 2023  (CN) .......................... 202310697738.7

(51) Int. Cl.
*H10F 71/00*  (2025.01)
*H10F 19/80*  (2025.01)

(52) U.S. Cl.
CPC ............. *H10F 71/00* (2025.01); *H10F 19/80* (2025.01)

(58) Field of Classification Search
CPC ..... H10F 71/00; H10F 19/80; H01L 2221/00; H01L 2221/67; H01L 21/02296; H01L 21/02112; H01L 21/67742; H01L 21/67259; H01L 21/68; H01L 21/67; H01L 21/677; H01L 21/00; H01L 21/02; H01L 21/02104; H01L 21/02107; H01L 21/02109; H01L 21/02225; H01L 21/67005; H01L 21/67011; H01L 21/67126; H01L 21/67132; H01L 21/67155; H01L 21/67161;
(Continued)

(56) References Cited

FOREIGN PATENT DOCUMENTS

| CN | 109158804 A | * | 1/2019 | ............ B23K 37/00 |
|----|-------------|---|--------|------------------------|
| CN | 213325931 U | * | 6/2021 | |
| CN | 217280812 U |   | 8/2022 | |

(Continued)

OTHER PUBLICATIONS

Machine translation of CN-109158804-A, from Wuxi Lead Intelligent Equipment. (Year: 2019).*

(Continued)

*Primary Examiner* — Mayla Gonzalez Ramos
(74) *Attorney, Agent, or Firm* — Taft Stettinius & Hollister LLP

(57) ABSTRACT

An automatic alignment device includes a component conveyor line, an alignment mechanism for aligning four sides of components on the component conveyor line, a camera group located above the component conveyor line for taking pictures of at least three right-angled edge areas of the component, a leveling mechanism located above the component conveyor line for leveling the film on the glass plate, a pressing mechanism located above the component conveyor line and configured to press a set position of the film in assisting the operation of the leveling mechanism, a film lifting mechanism located above the component conveyor line and configured to move the flattened film upwards, and a welding mechanism arranged above the component conveyor line to fix at a set position the film on the glass module.

8 Claims, 7 Drawing Sheets

(58) Field of Classification Search
CPC ............. H01L 21/67184; H01L 21/673; H01L 21/67703; H01L 21/67706; H01L 21/683
See application file for complete search history.

(56) References Cited

FOREIGN PATENT DOCUMENTS

| | | |
|---|---|---|
| CN | 217788419 U | 11/2022 |
| CN | 217983363 U | 12/2022 |
| CN | 116002419 A | 4/2023 |
| KR | 20220109324 A * | 8/2022 |

OTHER PUBLICATIONS

Machine translation of CN-213325931-U, Pan X. (Year: 2021).*
Machine translation of KR-20220109324-A, Tani K. (Year: 2022).*

* cited by examiner

AUTOMATIC ALIGNMENT DEVICE AND ALIGNMENT METHOD FOR PHOTOVOLTAIC MODULE FILM

CROSS-REFERENCE TO RELATED APPLICATION(S)

This application claims priority to Chinese Patent Application No. 202310697738.7 filed Jun. 13, 2023, the disclosure of which is incorporated herein by reference in its entirety.

TECHNICAL FIELD

This invention pertains to the technical field of photovoltaic module production, and in particular relates to an automatic alignment device for a photovoltaic module film and an automatic alignment method for a photovoltaic module film.

BACKGROUND

Photovoltaic modules are power generation modules that can convert solar energy into electrical energy. In the assembly process of photovoltaic modules, a layer of film needs to be laid on a glass plate, and then solar cells are arranged on the film. After the solar cells are connected together by hot-melt welding, a backsheet is placed on the top of the solar cells. If the photovoltaic module is a double-glass module, a glass plate is further placed on the backsheet, and then lamination, edge sealing and framing operations are carried out. Before the battery cells are laid out, the film must be aligned with the glass plate in edges. However, during the transportation of the glass components and after the film is laid, the film often bulges and becomes uneven, or due to insufficient laying accuracy of the film or factors in the component transportation process, the film is deviated from the glass plate in plane position. Therefore, it is necessary to correct the deviation of the film on the glass plate to ensure the quality of subsequent processes. However, in the prior art, only a leveling mechanism for flattening the film can be found, such as a hot-melt device for flattening the film of a photovoltaic module disclosed in the Patent publication No. CN217788419U. Although this mechanism can solve the problem of uneven local bulging of the film, it cannot solve the problem of deviation between the film and the glass plate.

It is necessary to provide a novel automatic alignment device for a photovoltaic module film, an automatic alignment method for a photovoltaic module film and an assembly method to solve the above technical problems.

SUMMARY

One of aspects of the present invention is to provide an automatic alignment device for a photovoltaic module film, which can smooth the film on the glass plate and align edges of the film with edges of the glass plate, and accurately fix the film on the glass plate, thereby providing a reliable position basis for subsequent battery cell layout.

In the present invention, the above aspect is achieved through the following technical solutions: an automatic alignment device for a photovoltaic module film, which includes: a component conveyor line, an alignment mechanism, a leveling mechanism, a pressing mechanism, a camera group, a film lifting mechanism and a welding mechanism.

The component conveyor line is configured to convey a glass component.

The alignment mechanism includes at least two first alignment modules configured to be located at one long edge side of the glass component, at least two second alignment modules configured to be located at the other long edge side of the glass component opposite to the one long edge side, at least one third alignment module configured to be located at the other short edge side of the glass component opposite to the one short edge side, and at least two fourth alignment modules located at the other opposite short edge side.

The leveling mechanism is configured to flatten a film on a glass plate in the glass component.

The pressing mechanism is configured to press the film when the leveling mechanism is in action.

The camera group is configured to take pictures of at least three right-angled edge areas of the glass component to obtain edge positions of a flattened film.

The film lifting mechanism is configured to lift the film upward and away from a surface of the glass plate.

The welding mechanism is configured to fix the film to the surface of the glass plate at a set position by welding.

Further, each of the first alignment modules includes a first cylinder, a second cylinder driven by the first cylinder to move in a direction parallel to the component conveyor line, and a first alignment wheel configured to be driven by the second cylinder to move up and down; and the third alignment module includes a fourth cylinder and a third alignment wheel configured to be driven by the fourth cylinder to move in a direction perpendicular to the component conveyor line.

Further, each of the second alignment modules includes a first motor, a first support plate configured to be driven by the first motor to move in a direction parallel to the component conveyor line, a third cylinder fixed on the first support plate, and a second alignment wheel configured to be driven by the third cylinder to move up and down.

Each of the fourth alignment modules includes a second motor, a second support plate configured to be driven by the second motor to move in a direction perpendicular to the component conveyor line, and a fourth alignment wheel fixed on the second support plate.

Further, the leveling mechanism includes a third motor and a leveling module configured to be driven by the third motor to move horizontally.

Further, the leveling module includes a fifth cylinder and a leveling plate configured to be driven by the fifth cylinder to move up and down.

Further, the pressing mechanism includes a sixth cylinder and a pressing plate configured to be driven by the sixth cylinder to move up and down.

Further, the leveling mechanism is arranged on a first crossbeam, and the first crossbeam is located above a middle part of the component conveyor line and is arranged in a direction perpendicular to the component conveyor line; the clamping mechanism is arranged on a second crossbeam, and the second crossbeam is located above the middle part of the component conveyor line and below the first crossbeam and is arranged in a direction parallel to the component conveyor line; and the pressing plate is vertically movable and is arranged below the second crossbeam and parallel to the second crossbeam.

Further, the film lifting mechanism includes two lifting modules, a first activity space for the leveling module to move horizontally is defined between the two lifting modules, and the first crossbeam is arranged in the first activity space.

Each of the two lifting modules includes a fourth motor and two adsorption modules configured to be driven by the fourth motor to move up and down, a second activity space for the pressing plate to move up and down is defined between the two adsorption modules, and the second crossbeam is arranged in the second activity space.

Further, the welding mechanism is provided with two modules respectively arranged at two ends of the pressing plate, and each of the two modules includes a seventh cylinder and a welding head configured to be driven by the seventh cylinder to move up and down.

Another aspect of the present invention is to provide an automatic alignment method for a photovoltaic module film, which includes the following steps: S1 to S8.

In S1, four alignment modules are used to align four edges of a glass component as an incoming material, and then the four alignment modules are retracted to be at a set distance from the four edges of a glass plate. The four alignment modules include at least two first alignment modules located at one long edge side of the glass component, at least two second alignment modules located at the other long edge side of the glass component opposite to the one long edge side, at least one third alignment module located at one short edge side of the glass component, and at least two fourth alignment modules located at the other short edge side opposite to the one short edge side.

In S2, a pressing mechanism is used to press one side or a middle part of the film, and a leveling mechanism is used to flatten the film on the glass plate.

In S3, a camera group is used to take photos of at least three right-angled edge areas of the glass component to obtain long edge contour positions and short edge contour positions of the film on the glass plate.

In S4, a film lifting mechanism is used to lift the flattened film on the glass plate upward to a set height away from a surface of the glass plate.

In S5, alignment wheels in the at least two second alignment modules and alignment wheels in the at least two fourth alignment modules are moved to the long edge contour positions and the short edge contour positions of the film respectively.

In S6, alignment wheels in the at least two first alignment modules are extended to push one long edge of the glass plate, to make the other opposite long edge of the glass plate opposite to the one long edge to abut against the alignment wheels in the at least two second alignment modules.

In S7, an alignment wheel in the at least one third alignment module is extended to push one short edge of the glass plate, to make the other short edge of the glass plate opposite to abut against the alignment wheels in the at least two fourth alignment modules.

In S8, the film lifting mechanism puts the film back onto the glass plate, at this time, the four edges of the film are aligned with the four edges of the glass plate, thus completing the alignment for the film.

The beneficial effects of the automatic alignment device for a photovoltaic module film and automatic alignment method for a photovoltaic module film according to the present invention lie in that: being capable of smoothing the film on the glass plate and aligning the four edges of the film with the four edges of the glass plate, and accurately fixing the film on the glass plate, thereby providing a reliable position basis for subsequent battery cell layout. The specific aspects are as follow.

(1) By providing the film leveling mechanism and pressing mechanism, the film in the incoming glass component is smoothed, which lays a precise position foundation for subsequent film alignment.

(2) Four alignment modules are arranged at the four edges of the glass component, specifically, the alignment modules at two adjacent right-angled edges are embodied as alignment wheels driven by servo motors, the camera group above the glass component is used to obtain the long edge contour position information and short edge contour position information of the smoothed film, the film lifting mechanism is used to lift the film upward, and then servo motors are used to drive the corresponding alignment wheels to move to the long edge contour position and the short edge contour position, so as to provide a contour position limit reference aligned with the edges of the film for the position adjustment of the glass plate on the component conveyor line, the alignment wheels at the other two adjacent edges extend to push the glass plate against the alignment wheels driven by the servo motors, thereby realizing the position adjustment to the glass plate, to allow the four edges of the glass plate to be aligned with the four edges of the film, and then the film lifting mechanism puts the film back onto the adjusted glass plate, thus completing the alignment between the glass plate and the film, and thereby providing a reliable position basis for the subsequent battery cell layout.

(3) By rectifying the positions of the film and the glass plate, the problem of uneven adhesive overflow after subsequent lamination can be solved, and the subsequent cleaning and edge trimming processes can be omitted.

REFERENCE NUMERALS IN THE FIGURES REPRESENT

Figure 1:
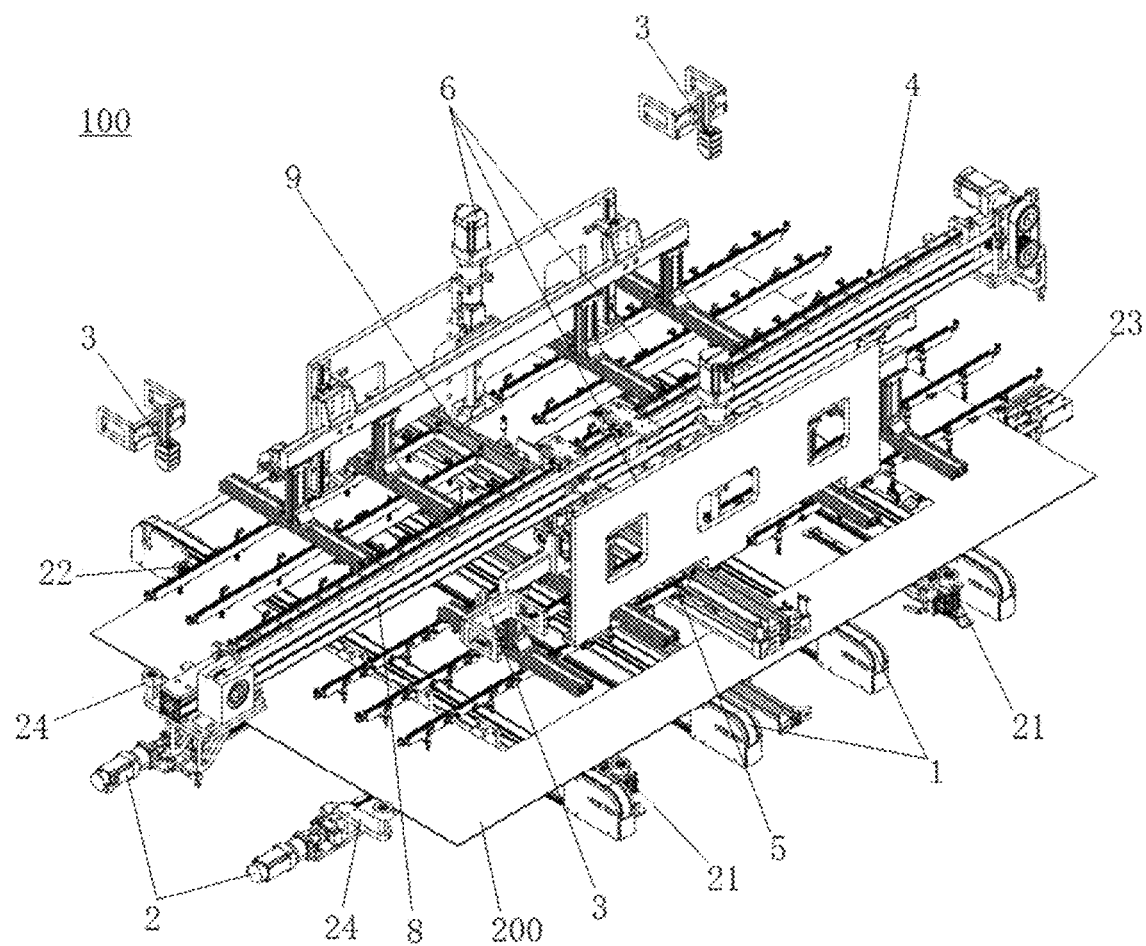
FIG. 1 is a schematic perspective view of the structure of an embodiment of the present invention.
Figure 2:
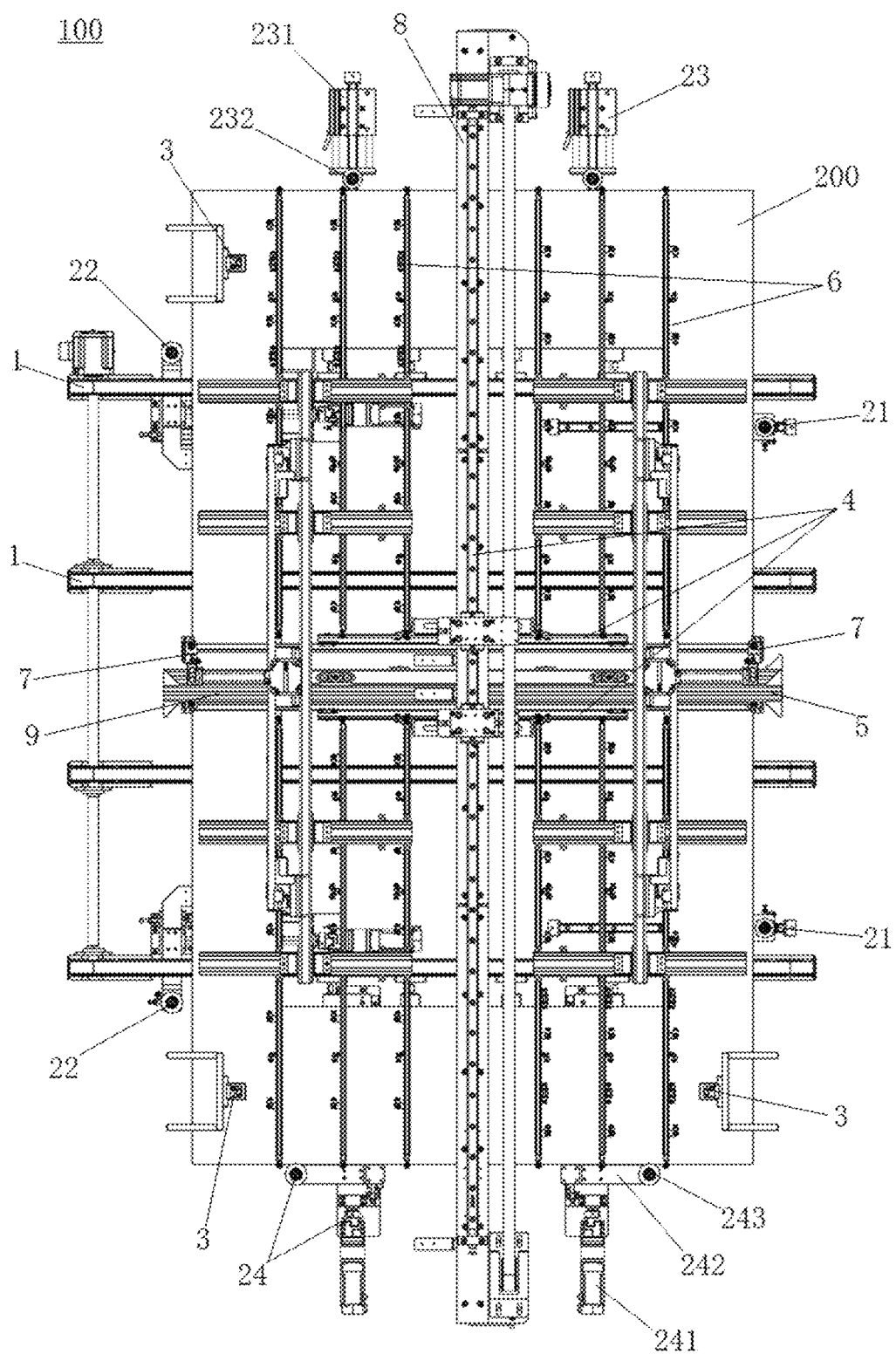
FIG. 2 is a schematic top view of the structure of an embodiment of the present invention.
Figure 3:
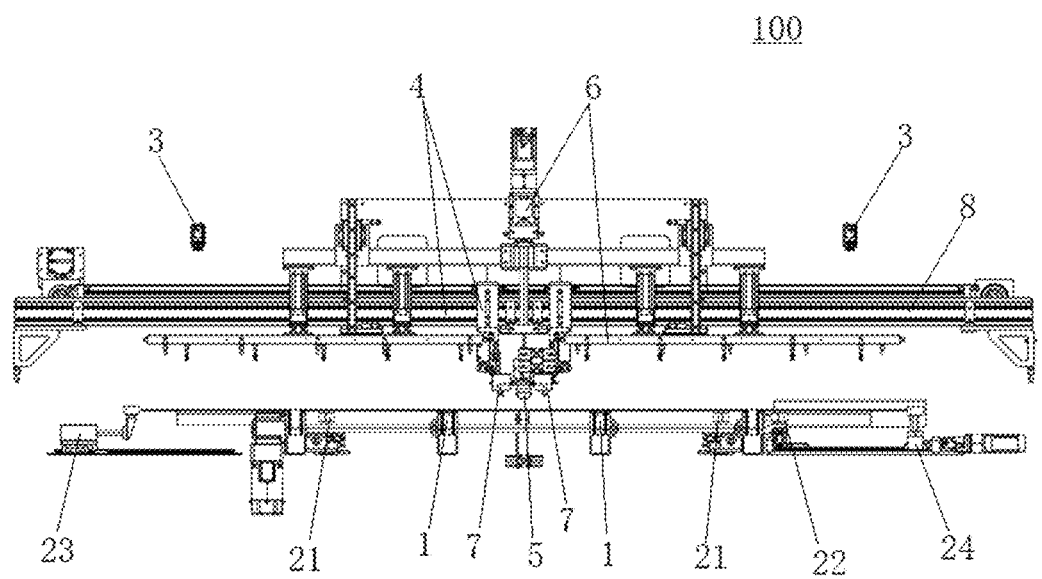
FIG. 3 is a schematic side view of the structure of an embodiment of the present invention.
Figure 4:
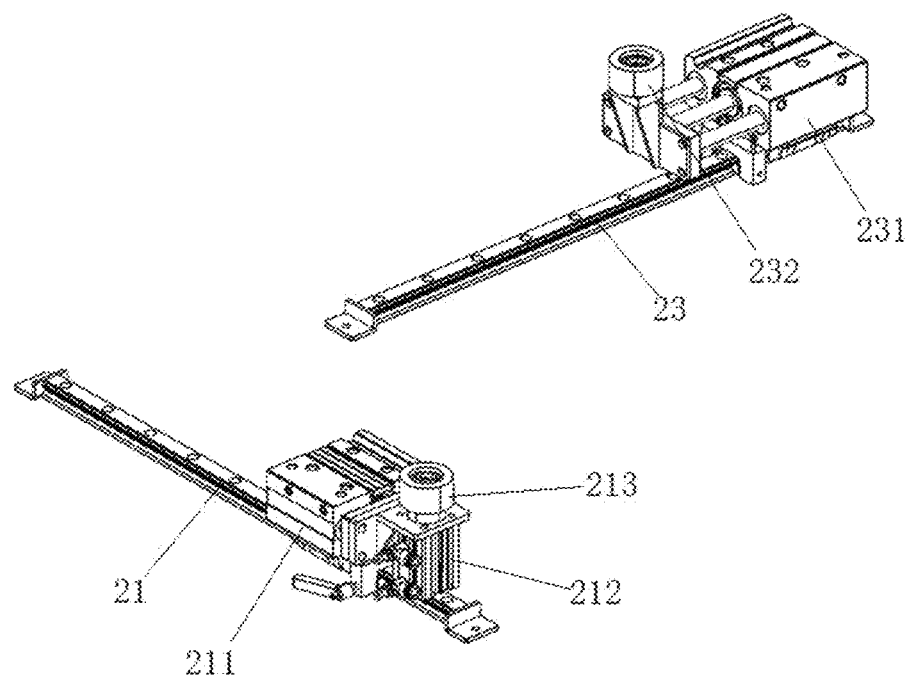
FIG. 4 is a schematic structural diagram of the first alignment module and the third alignment module in an embodiment of the present invention.
Figure 5:
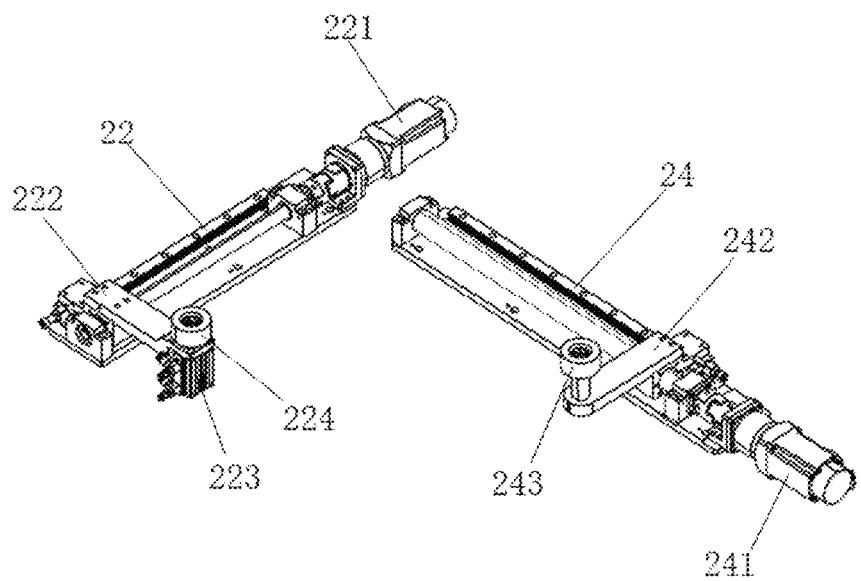
FIG. 5 is a schematic structural diagram of the second alignment module and the fourth alignment module in an embodiment of the present invention.
Figure 6:
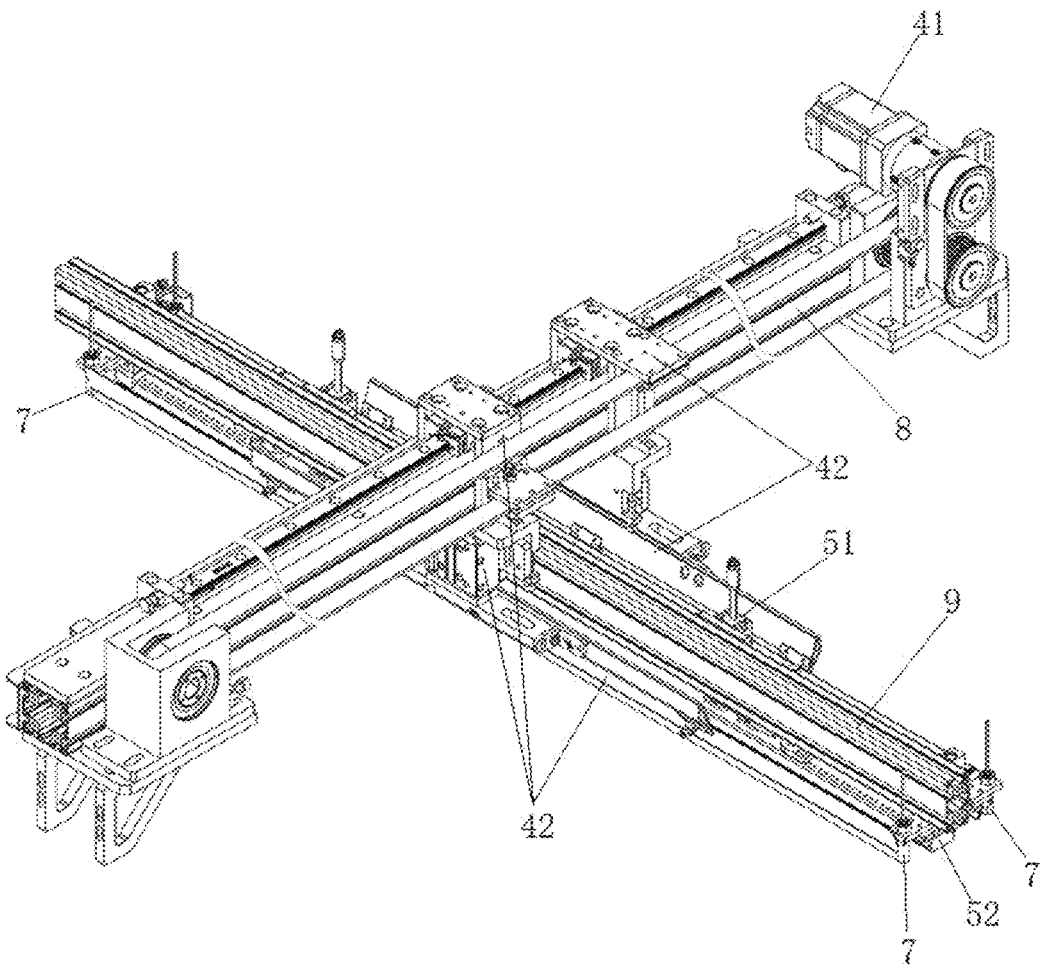
FIG. 6 is a schematic structural diagram of a leveling mechanism, a pressing mechanism and a welding mechanism in an embodiment of the present invention.
Figure 7:
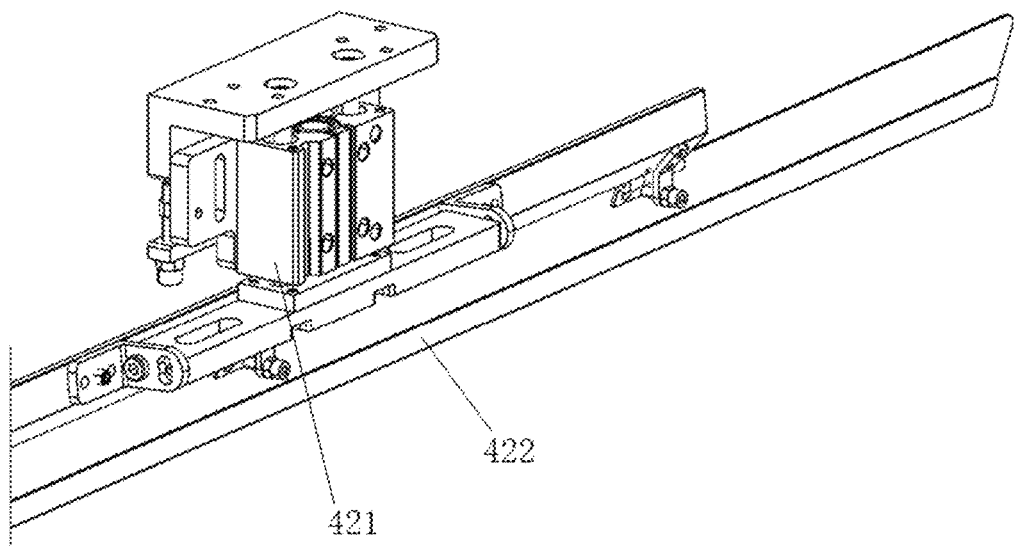
FIG. 7 is a schematic diagram of a partial structure of the leveling mechanism in an embodiment of the present invention.
Figure 8:
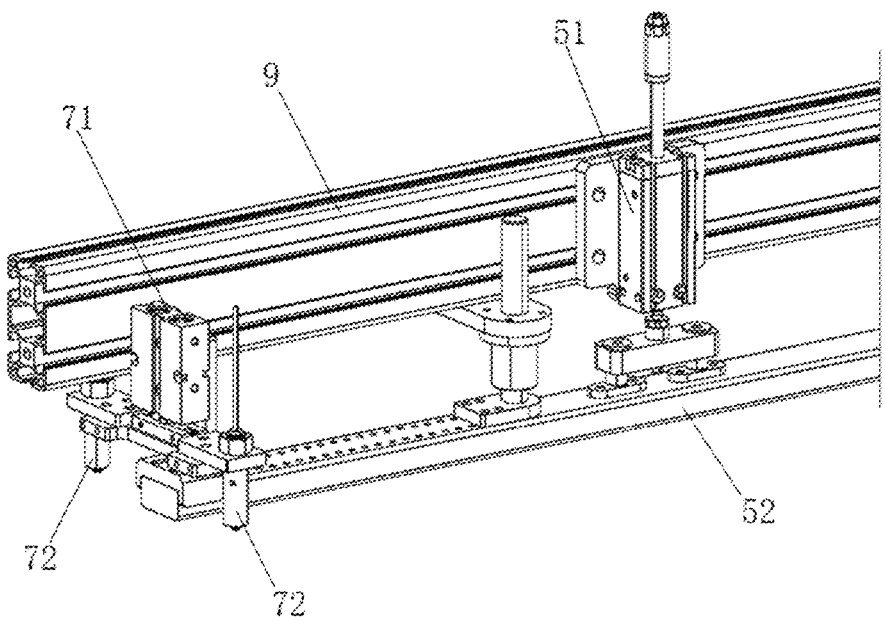
FIG. 8 is a schematic diagram of a partial structure of the pressing mechanism and the welding mechanism in an embodiment of the present invention.
Figure 9:
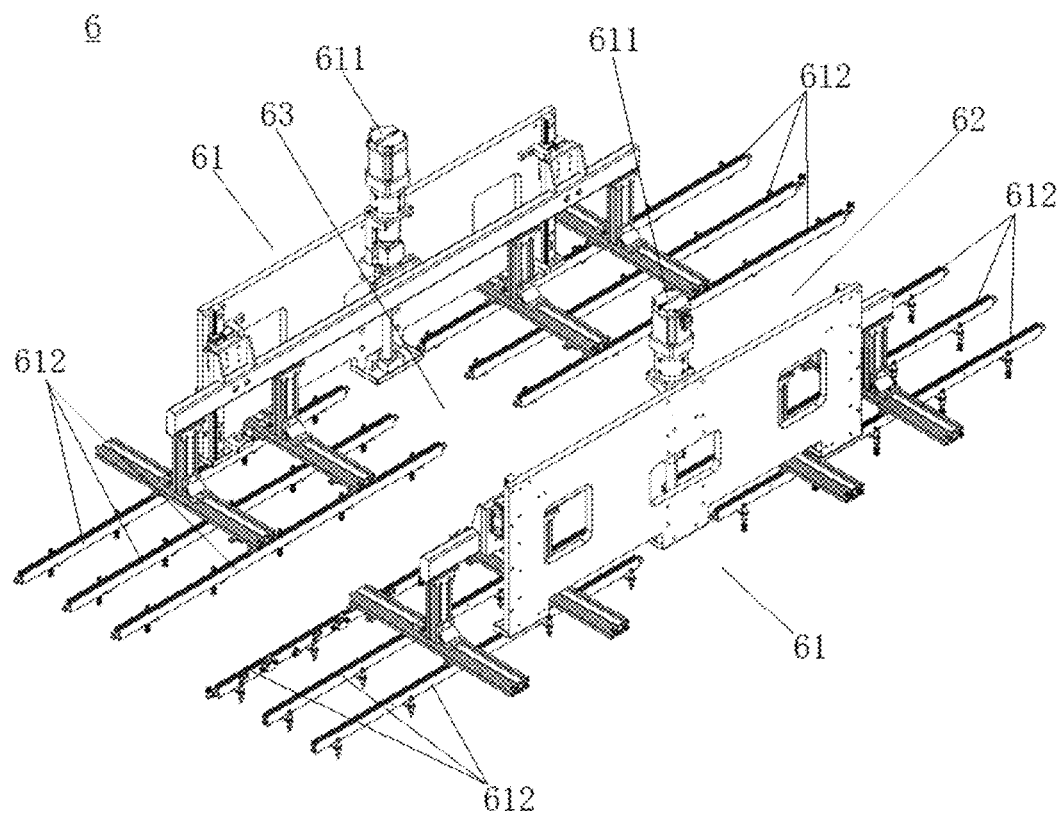
FIG. 9 is a schematic structural diagram of a film lifting mechanism according to an embodiment of the present invention.

100-automatic alignment device for a photovoltaic module film 200-glass component
201-glass plate
202-film
1-component conveyor line
2-alignment mechanism
21-first alignment module
211-first cylinder
212-second cylinder
213-first alignment wheel
22-second alignment module
221-first motor
222-first support plate
223-third cylinder
224-second alignment wheel
23-third alignment module
231-fourth cylinder
232-third alignment wheel
24-fourth alignment module
241-second motor
242-second support plate
243-fourth alignment wheel
3-camera group
4-leveling mechanism
41-third motor
42-leveling module
421-fifth cylinder
422-leveling plate
5-pressing mechanism
51-sixth cylinder
52-pressing plate
6-film lifting mechanism
61-lifting module
611-fourth motor
612-adsorption module
62-first activity space
63-second activity space
7-welding mechanism
71-seventh cylinder
72-welding head
8-first crossbeam
9-second crossbeam.

DETAILED DESCRIPTION

Embodiment One

Reference is made to FIGS. 1 to 10. This embodiment is an automatic alignment device 100 for a photovoltaic module film, which includes a component conveyor line 1, an alignment mechanism 2 for aligning four sides of components on the component conveyor line 1, a camera group 3 located above the component conveyor line 1 for taking pictures of at least three right-angled areas of the component, a leveling mechanism 4 located above the component conveyor line 1 for leveling a film 202 on a glass plate 201 flat, a pressing mechanism 5 located above the component conveyor line 1 and configured to press a set position of the film 202 in assisting the operation of the leveling mechanism 4, a film lifting mechanism 6 located above the component conveyor line 1 and configured to move the flattened film upwards, and a welding mechanism 7 arranged above the component conveyor line 1 to fix at a set position the film on the glass module 200.

The glass component 200 has a first long edge and a second long edge opposite to each other, and a first short edge and a second short edge opposite to each other. The alignment mechanism 2 includes at least two first alignment modules 21 located at the first long edge side, at least two second alignment modules 22 located at the second long edge side, at least one third alignment module 23 located at the first short edge side, and at least two fourth alignment modules 24 located at the second short edge side.

The first alignment module 21 includes a first cylinder 211, a second cylinder 212 driven by the first cylinder 211 to move in a direction parallel to the component conveyor line 1, and a first alignment wheel 213 driven by the second cylinder 212 to move up and down.

The second alignment module 22 includes a first motor 221, a first support plate 222 driven by the first motor 221 to move in a direction parallel to the component conveyor line 1, a third cylinder 223 fixed on the first support plate 222, and a second alignment wheel 224 driven by the third cylinder 223 to move up and down.

The third alignment module 23 includes a fourth cylinder 231 and a third alignment wheel 232 driven by the fourth cylinder 231 to move in a direction perpendicular to the component conveyor line 1.

The fourth alignment module 24 includes a second motor 241, a second support plate 242 driven by the second motor 241 to move in a direction perpendicular to the component conveyor line 1, and a fourth alignment wheel 243 fixed on the second support plate 242.

The two second alignment modules 22 have two second alignment wheels 224 in total, thereby achieving a linear limit function. The two fourth alignment modules 24 have two fourth alignment wheels 243 in total, which can also achieve the linear limit function. Therefore, through the two second alignment modules 22 and the two fourth alignment modules 24, a right-angled edge limiting structure for limiting positions of the two right-angled edges (catheti) can be formed, and in conjunction with drive of the servo motors in the two sets of alignment modules, the position adjustment of the second alignment wheels 224 and the fourth alignment wheels 243 can be achieved to achieve the adjustment of the limit position of the right-angled edge limiting structure.

In this embodiment, the leveling mechanism 4 includes a third motor 41 and a pair of leveling modules 42 driven by the third motor 41 to perform opening and closing movements. In flattening the film, the leveling modules 42 flatten the film from the middle to two sides. The leveling modules 42 each include a fifth cylinder 421 and a leveling plate 422 driven by the fifth cylinder 421 to move up and down.

In other embodiments, the leveling mechanism 4 may also be configured as a single leveling module 42 to perform a flattening operation from one side of the film to another opposite side.

The pressing mechanism 5 includes a sixth cylinder 51 and a pressing plate 52 driven by the sixth cylinder 51 to move up and down. In this embodiment, the pressing mechanism 5 is located between the two leveling modules 42, and the pressing plate 52 is arranged parallel to the short edge direction of the glass component 200. Before the leveling mechanism 4 performs the flattening operation, a middle part of the film 202 is pressed by the pressing plate 52 so that the leveling mechanism 4 will not cause a large displacement of the overall position of the film when flattening the film.

In other embodiments, the pressing mechanism 5 may also be disposed above one side edge of the glass component 200 to press one side edge of the film 202, and then the leveling mechanism 4 performs a flattening operation from one side of the film 202 to the other opposite side.

In this embodiment, in order to be able to set the leveling mechanism 4, the pressing mechanism 5, the film lifting mechanism 6 and the welding mechanism 7 in the effective space above the component conveyor line 1, and to enable the movements of these four mechanisms not to interfere with each other, in this embodiment, the structure of the film lifting mechanism 6 is optimized, and the setting positions of the leveling mechanism 4, the pressing mechanism 5 and the film lifting mechanism 6 are reasonably arranged.

Specifically, in this embodiment, the leveling mechanism 4 is arranged on a first crossbeam 8, and the first crossbeam 8 is located above a middle part of the component conveyor line 1 and is arranged in a direction perpendicular to the component conveyor line 1. The leveling modules 42 are movably arranged on the first crossbeam 8, and act on the surface of the film 202 while moving along the first crossbeam 8. The pressing mechanism 5 is arranged on a second crossbeam 9, and the second crossbeam 9 is located above the middle part of the component conveyor line 1 and below the first crossbeam 8, and is arranged parallel to the component conveyor line 1. The pressing plate 52 is arranged below the second crossbeam 9 to be vertically movable and is arranged parallel to the second crossbeam 9.

In addition, the film lifting mechanism 6 includes two lifting modules 61. A first activity space 62 for the leveling modules 42 to move horizontally is defined between the two lifting modules 61. The first crossbeam 8 is arranged in the first activity space 62. The lifting module 61 includes a fourth motor 611 and two adsorption modules 612 driven by the fourth motor 611 to move up and down. A second activity space 63 for the pressing plate 52 to move up and down is defined between the two adsorption modules 612. The second crossbeam 9 is arranged in the second activity space 63. The two adsorption modules 612 adsorb together the film.

In this embodiment, the welding mechanism 7 is provided with two modules respectively arranged at two ends of the pressing plate 52, and each module includes a seventh cylinder 71 and a welding head 72 driven by the seventh cylinder 71 to move up and down. The welding head 72 in this embodiment fixes the film 202 on the glass plate 201 by hot melt welding in the form of spot welding.

An automatic alignment method based on the automatic alignment device for a photovoltaic module film is further provided according to this embodiment, which includes the following steps: S1 to S8.

Figure 10:
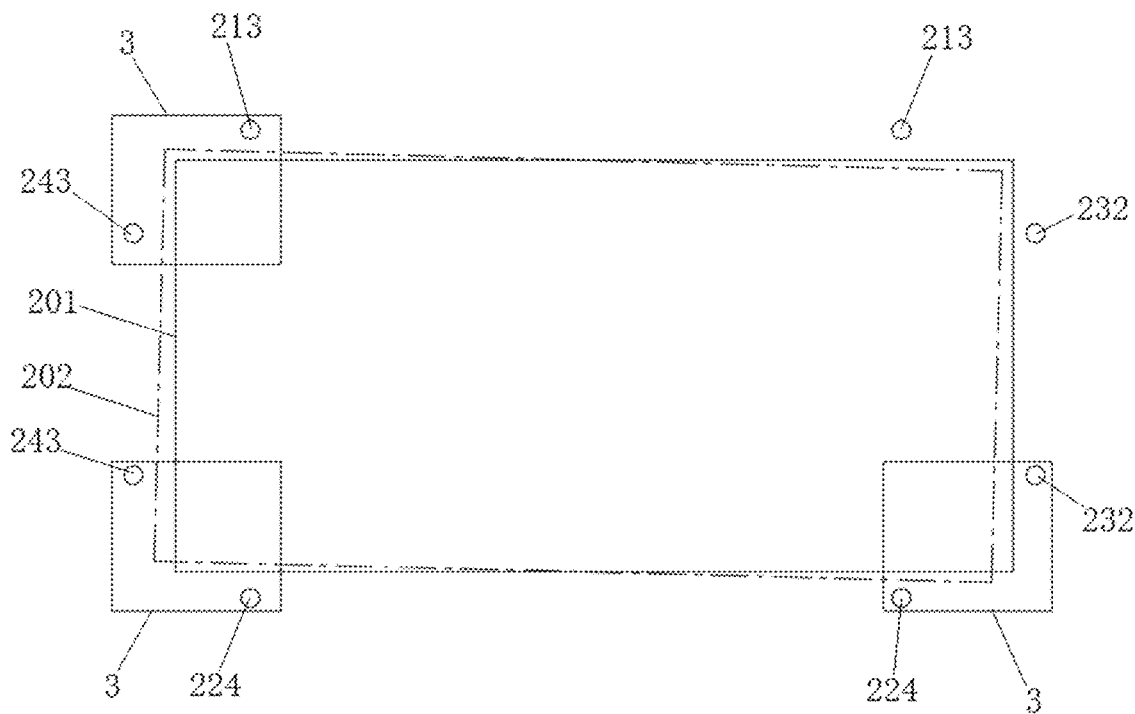
FIGS. 10-12 are schematic diagrams showing the principle of the alignment method in an embodiment of the present invention.

In S1, glass components 200 are conveyed to be in position along with the component conveyor line 1, and four alignment modules (i.e., the first alignment modules 21, the second alignment modules 22, the third alignment module 23 and the fourth alignment modules 24) firstly align four edges of a coming glass component 200, and then the four alignment modules are retracted to allow the multiple alignment wheels at the four sides to be at a set distance from the four edges of the glass plate 201. Since when the materials are incoming, the film 202 and the glass plate 201 may not be completely aligned with each other in the four side edges and be deviated from each other, and since the film 202 is soft, even by means of the alignment modules, only the four sides of the glass plate 201 can be aligned, but the film 202 on the glass plate 201 cannot be aligned, as shown in FIG. 10.

In S2, the pressing mechanism 5 presses one side or a middle part of the film 202, and the leveling mechanism 4 flattens the film 202 on the glass plate 201 to make it fully unfolded and keep it flat.

In S3, the camera group 3 is used to take photos of at least three right-angled edge areas of the glass component 200 to obtain long edge contour positions and short edge contour positions of the film 201.

In S4, the film lifting mechanism 6 lifts the flattened film on the glass plate 201 upward to a set height away from the surface of the glass plate 201.

Figure 11:
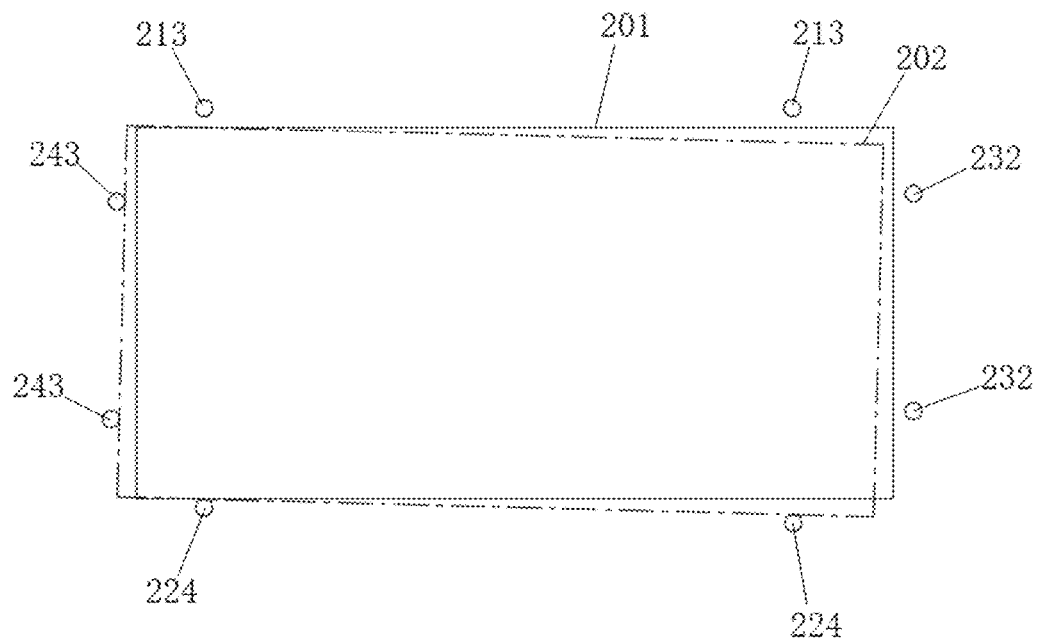

In S5, the servo motor of the two second alignment modules 22 and the servo motor of the two fourth alignment modules 24 are used to drive the corresponding alignment wheels to move to a long edge contour position and a short edge contour position of the film 202, as shown in FIG. 11.

In S6, the two first alignment wheels 213 located at the long edge side of the glass component 200 are used to extend to push one long edge of the glass plate 201, to allow the other long edge of the glass plate 201 opposite to the one long edge to abut against the second alignment wheels 224.

Figure 12:
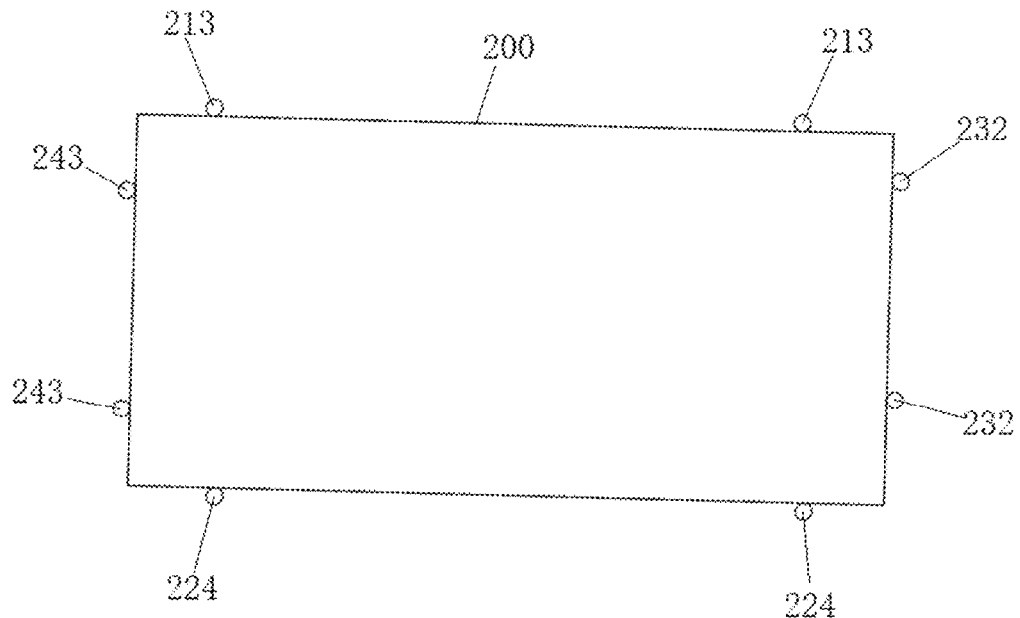

In S7, the third alignment wheel 232 located at the short edge side of the glass component 200 is used to extend to push one short edge of the glass plate, to allow the other short edge of the glass plate opposite to the one short edge to abut against the fourth alignment wheels 243, as shown in FIG. 12.

In S8, the film lifting mechanism 6 puts the film 202 back onto the glass plate 201, and at this time, the four edges of the film 202 are aligned with the four edges of the glass plate 201, and thus, the film alignment is completed.

What has been described above are only some embodiments of the present invention. For the person of ordinary skills in the art, several modifications and improvements can be made without departing from the inventive concept of the present invention, which all fall within the protection scope of the present invention.

What is claimed is:

1. An automatic alignment device for a photovoltaic module film, comprising:
   a component conveyor line configured to convey a glass component;
   an alignment mechanism comprising at least two first alignment modules configured to be located at one long edge side of the glass component, at least two second alignment modules configured to be located at another long edge side of the glass component opposite to the one long edge side, at least one third alignment module configured to be located at one short edge side of the glass component, and at least two fourth alignment modules configured to be located at another short edge side of the glass component opposite to the one short edge side;
   a leveling mechanism configured to flatten a film on a glass plate in the glass component;
   a pressing mechanism configured to press the film when the leveling mechanism is in action;
   a camera group configured to take pictures of at least three right-angled edge areas of the glass component to obtain edge positions of a flattened film;
   a film lifting mechanism configured to lift the film upward and away from a surface of the glass plate; and
   a welding mechanism configured to fix the film to the surface of the glass plate at a set position by welding;
   wherein the pressing mechanism comprises a sixth cylinder and a pressing plate configured to be driven by the sixth cylinder to move up and down; and wherein the leveling mechanism is arranged on a first crossbeam, and the first crossbeam is located above a middle part of the component conveyor line and is arranged in a direction perpendicular to the component conveyor line; the pressing mechanism is arranged on a second crossbeam, and the second crossbeam is located above the middle part of the component conveyor line and below the first crossbeam and is arranged in a direction parallel to the component conveyor line; and the pressing plate is vertically movable and is arranged below the second crossbeam and parallel to the second crossbeam.

2. The automatic alignment device for the photovoltaic module film according to claim 1, wherein each of the at least two first alignment modules comprises a first cylinder, a second cylinder configured to be driven by the first cylinder to move in a direction parallel to the component conveyor line, and a first alignment wheel configured to be driven by the second cylinder to move up and down; and each of the at least one third alignment module comprises a fourth cylinder and a third alignment wheel configured to be driven by the fourth cylinder to move in a direction perpendicular to the component conveyor line.

3. The automatic alignment device for the photovoltaic module film according to claim 1, wherein each of the at least two second alignment modules comprises a first motor, a first support plate configured to be driven by the first motor to move in a direction parallel to the component conveyor line, a third cylinder fixed on the first support plate, and a second alignment wheel configured to be driven by the third cylinder to move up and down; and each of the at least two fourth alignment modules comprises a second motor, a second support plate configured to be driven by the second motor to move in a direction perpendicular to the component conveyor line, and a fourth alignment wheel fixed on the second support plate.

4. The automatic alignment device for the photovoltaic module film according to claim 1, wherein the leveling mechanism comprises a third motor and a leveling module configured to be driven by the third motor to move horizontally.

5. The automatic alignment device for the photovoltaic module film according to claim 4, wherein the leveling module comprises a fifth cylinder and a leveling plate configured to be driven by the fifth cylinder to move up and down.

6. The automatic alignment device for the photovoltaic module film according to claim 1, wherein the film lifting mechanism comprises two lifting modules, a first activity space for the leveling module to move horizontally is defined between the two lifting modules, and the first crossbeam is arranged in the first activity space; and each of the two lifting modules comprises a fourth motor and two adsorption modules configured to be driven by the fourth motor to move up and down, a second activity space for the pressing plate to move up and down is defined between the two adsorption modules, and the second crossbeam is arranged in the second activity space.

7. The automatic alignment device for the photovoltaic module film according to claim 1, wherein the welding mechanism is provided with two modules, the two modules are respectively arranged at two ends of the pressing plate, and each of the two modules comprises a seventh cylinder and a welding head configured to be driven by the seventh cylinder to move up and down.

8. An automatic alignment method for a photovoltaic module film, applied to an automatic alignment device for the photovoltaic module film, comprising following steps:

using four alignment modules of an alignment mechanism of the automatic alignment device to align four edges of a glass component as an incoming material which is conveyed by a component conveyor line of the automatic alignment device, and then retracting the four alignment modules to be at a set distance from the four edges of a glass plate; wherein the four alignment modules comprise at least two first alignment modules located at one long edge side of the glass component, at least two second alignment modules located at another long edge side of the glass component opposite to the one long edge side, at least one third alignment module located at one short edge side of the glass component, and at least two fourth alignment modules located at another short edge side of the glass component opposite to the one short edge side;

using a pressing plate of a pressing mechanism of the automatic alignment device to press one side or a middle part of a film on the glass plate in the glass component, and using a leveling mechanism of the automatic alignment device to flatten the film, wherein the leveling mechanism is arranged on a first crossbeam, and the first crossbeam is located above a middle part of the component conveyor line and is arranged in a direction perpendicular to the component conveyor line; the leveling module is movably arranged on the first crossbeam, and acts on a surface of the film while moving along the first crossbeam; the pressing mechanism is arranged on a second crossbeam, and the second crossbeam is located above the middle part of the component conveyor line and below the first crossbeam, and is arranged parallel to the component conveyor line; the pressing plate is arranged below the second crossbeam to be vertically movable and is arranged parallel to the second crossbeam;

using a camera group of the automatic alignment device to take photos of at least three right-angled edge areas of the glass component to obtain long edge contour positions and short edge contour positions of the flatten film on the glass plate;

using a film lifting mechanism of the automatic alignment device to lift the flattened film on the glass plate upward to a set height away from a surface of the glass plate;

moving alignment wheels in the at least two second alignment modules and alignment wheels in the at least two fourth alignment modules to the long edge contour positions and the short edge contour positions of the flatten film respectively;

extending alignment wheels in the at least two first alignment modules to push one long edge of the glass plate, to make another long edge of the glass plate opposite to the one long edge to abut against the alignment wheels in the at least two second alignment modules;

extending an alignment wheel in the at least one third alignment module to push one short edge of the glass plate, to make another short edge of the glass plate opposite to the one short edge to abut against the alignment wheels in the at least two fourth alignment modules; and using the film lifting mechanism to put the flatten film back onto the glass plate, and using a welding mechanism to fix the flatten film to the surface of the glass plate at a set position by welding, wherein at this time, the four edges of the film are aligned with the four edges of the glass plate, and an alignment for the film is completed.

* * * * *